United States Patent
Murphy

(10) Patent No.: US 11,908,546 B2
(45) Date of Patent: *Feb. 20, 2024

(54) IN-MEMORY LIGHTWEIGHT MEMORY COHERENCE PROTOCOL

(71) Applicant: Micron Technology, Inc., Boise, ID (US)

(72) Inventor: Richard C Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 423 days.

This patent is subject to a terminal disclaimer.

(21) Appl. No.: 17/066,422

(22) Filed: Oct. 8, 2020

(65) Prior Publication Data
US 2021/0125649 A1    Apr. 29, 2021

Related U.S. Application Data

(63) Continuation of application No. 14/706,490, filed on May 7, 2015, now Pat. No. 10,825,496.
(Continued)

(51) Int. Cl.
*G06F 12/02* (2006.01)
*G06F 12/0815* (2016.01)
(Continued)

(52) U.S. Cl.
CPC ............ *G11C 8/12* (2013.01); *G06F 12/0284* (2013.01); *G06F 12/0815* (2013.01);
(Continued)

(58) Field of Classification Search
CPC ............ G06F 12/0284; G06F 12/0815; G06F 12/0817; G06F 12/1072; G06F 12/0824; G06F 12/084
See application file for complete search history.

(56) References Cited

U.S. PATENT DOCUMENTS

| 5,561,622 A | 10/1996 | Bertin et al. |
| 6,415,364 B1 | 7/2002 | Bauman et al. |

(Continued)

FOREIGN PATENT DOCUMENTS

| CN | 1967709 A | 5/2007 |
| CN | 102157187 A | 8/2011 |

(Continued)

OTHER PUBLICATIONS

Gwangsun Kim, John Kim, Jung Ho Ahn, Jaeha Kim, Memory-centric system interconnect design with hybrid memory cubes, Oct. 7, 2013, 145-155 (Year: 2013).*

(Continued)

*Primary Examiner* — Michelle T Bechtold
(74) *Attorney, Agent, or Firm* — Schwegman Lundberg & Woessner, P.A.

(57) ABSTRACT

A system includes a plurality of host processors and a plurality of HMC devices configured as a distributed shared memory for the host processors. An HMC device includes a plurality of integrated circuit memory die including at least a first memory die arranged on top of a second memory die and at least a portion of the memory of the memory die is mapped to include at least a portion of a memory coherence directory; and a logic base die including at least one memory controller configured to manage three-dimensional (3D) access to memory of the plurality of memory die by at least one second device, and logic circuitry configured to determine memory coherence state information for data stored in the memory of the plurality of memory die, communicate information regarding the access to memory, and include the memory coherence information in the communicated information.

20 Claims, 7 Drawing Sheets

FOUR-LINK, SIMPLE TOPOLOGY

FOUR-LINK, MESH TOPOLOGY

FOUR-LINK, RING TOPOLOGY

FOUR-LINK, 2D TORUS TOPOLOGY

Related U.S. Application Data

(60) Provisional application No. 61/990,199, filed on May 8, 2014.

(51) Int. Cl.

| | | |
|---|---|---|
| *G06F 12/0817* | (2016.01) | |
| *G06F 12/1072* | (2016.01) | |
| *G06F 12/084* | (2016.01) | |
| *G11C 8/12* | (2006.01) | |
| *G11C 5/02* | (2006.01) | |

(52) U.S. Cl.
CPC ...... *G06F 12/0817* (2013.01); *G06F 12/1072* (2013.01); *G11C 5/02* (2013.01); *G11C 5/025* (2013.01); *G06F 12/084* (2013.01); *G06F 12/0824* (2013.01); *G06F 2212/1032* (2013.01); *G06F 2212/1048* (2013.01); *G06F 2212/251* (2013.01); *G06F 2212/3042* (2013.01)

(56) References Cited

U.S. PATENT DOCUMENTS

| | | | |
|---|---|---|---|
| 7,934,060 | B1 | 4/2011 | Corbett et al. |
| 10,825,496 | B2 | 11/2020 | Murphy |
| 2004/0034747 | A1* | 2/2004 | Rowlands ............ G06F 12/0824 711/119 |
| 2006/0129709 | A1 | 6/2006 | Bandholz et al. |
| 2009/0147557 | A1 | 6/2009 | Lahtinen et al. |
| 2013/0138892 | A1* | 5/2013 | Loh ........................ G06F 12/123 711/134 |
| 2014/0181417 | A1* | 6/2014 | Loh .......................... H01L 25/18 711/141 |
| 2015/0325272 | A1 | 11/2015 | Murphy |
| 2015/0378913 | A1* | 12/2015 | Jouppi ................ G06F 12/0844 711/119 |
| 2016/0092362 | A1 | 3/2016 | Barron et al. |

FOREIGN PATENT DOCUMENTS

| | | |
|---|---|---|
| CN | 102918649 A | 2/2013 |
| CN | 106415522 A | 2/2017 |
| CN | 106415522 B | 7/2020 |
| EP | 3140749 | 1/2021 |
| KR | 10-1887797 B1 | 8/2018 |
| TW | 201411642 A | 3/2014 |
| TW | 201414392 A | 4/2014 |
| TW | 201612753 A | 4/2016 |
| TW | 202024920 A | 7/2020 |
| WO | WO-2015171905 A1 | 11/2015 |

OTHER PUBLICATIONS

"Chinese Application Serial No. 201580030595.8, Office Action dated Feb. 3, 2020", w/ English Translation, 7 pgs.
"Chinese Application Serial No. 201580030595.8, Office Action dated Jul. 2, 2019", w/ English translation, 49 pgs.
"Chinese Application Serial No. 201580030595.8, Office Action dated Sep. 20, 2018", w/ English translation, 44 pgs.
"Chinese Application Serial No. 201580030595.8, Response Filed Feb. 3, 2019 to Office Action dated Sep. 20, 2018", w/English Claims, 21 pgs.
"Chinese Application Serial No. 201580030595.8, Response filed Apr. 1, 2020 to Office Action dated Feb. 3, 2020", w/ English Claims, 15 pgs.
"Chinese Application Serial No. 201580030595.8, Response filed Sep. 17, 2019 to Office Action dated Jul. 2, 2019", w/ English Claims, 23 pgs.
"European Application Serial No. 15789090.6, Communication Pursuant to Article 94(3) EPC dated Jan. 24, 2020", 8 pgs.
"European Application Serial No. 15789090.6, Extended European Search Report dated Dec. 8, 2017", 11 pgs.
"European Application Serial No. 15789090.6, Response filed May 27, 2020 to Communication Pursuant to Article 94(3) EPC dated Jan. 24, 2020", 6 pgs.
"European Application Serial No. 15789090.6, Response filed Jun. 7, 2017 to Communication pursuant to Rules 161(2) and 162 EPC dated Dec. 16, 2016", 14 pgs.
"HMC_Specification 1_0", [Online] Retrieved from the Internet : <https://web.archive.org/web/20140214001835/http://hybridmemorycube.org/files/SiteDownloads/HMC_Specification1_0.pdf>, (Feb. 14, 2014).
"Hybrid Memory Cube Specification 1.0", Hybrid Memory Cube Consortium, [Online]. Retrieved from the Internet: <URL: http://www.hybridmemorycube.org/files/SiteDownloads/HMC_Specification%201_0.pdf>, (Jan. 2013), 122 pages.
"International Application Serial No. PCT/US2015/029705, International Preliminary Report on Patentability dated Nov. 17, 2016", 6 pgs.
"International Application Serial No. PCT/US2015/029705, International Search Report dated Jun. 29, 2015", 3 pgs.
"International Application Serial No. PCT/US2015/029705, Written Opinion dated Jun. 29, 2015", 4 pgs.
"Korean Application Serial No. 10-2016-7034167, Notice of Preliminary Rejection dated Dec. 27, 2017", (English Translation), 13 pgs.
"Korean Application Serial No. 10-2016-7034167, Response filed Feb. 27, 2018 to Notice of Preliminary Rejection dated Dec. 27, 2017", w/English Claims, 26 pgs.
"Taiwanese Application Serial No. 104114781, Decision of Rejection dated Jul. 29, 2019", W/ English Translation, 10 pgs.
"Taiwanese Application Serial No. 104114781, Office Action dated Mar. 19, 2019", W/ English Translation, 22 pgs.
"Taiwanese Application Serial No. 104114781, Response filed Jun. 19, 2019 to Office Action dated Mar. 19, 2019", w/ English Claims, 27 pgs.
"Taiwanese Application Serial No. 104114781, Response filed Oct. 1, 2019 to Decision of Rejection dated Jul. 29, 2019", w/ English Claims, 31 pgs.
Gwangsun, Kim, et al., "Memory-centric system interconnect design with hybrid memory cubes", Proceedings of the 22nd International Conference on Parallel Architectures and Compilation Techniques, [Online] Retrieved from the internet: <http://bt.nitk.ac.in/c/16a/co471/notes/Memory-centric%20System%201nterconnect%20Design%20with%20Hybrid%2OMemory%20Cubes. pdf>, (Oct. 7, 2013), 145-156.
Joe, Jeddeloh, et al., "Hybrid memory cube new DRAM architecture increases density and performance", VLSI Technology (VLSIT), 2012 Symposium on, IEEE, (Jun. 12, 2012), 87-88.
Kaist, Gwangsun Kim, et al., "Memory-centric system interconnect design with hybrid memory cubes", (Oct. 7, 2013), 145-155 pgs.
Leidel, John D., et al., "HMC-Sim: A Simulation Framework for Hybrid Memory Cube Devices", [Online]. Retrieved from the Internet: <URL: http://discl.cs.ttu.edu/lib/exe/fetch.php?media=wiki:papers:lspp14_jleidel_camera_ready_ieee.pdf>, (Accessed May 8, 2014), 10 pgs.
Pawlowski, J. T, et al., "Hybrid Memory Cube (HMC)", Proceedings of the 23rd Hot Chips Symposium, Retrieved from the Internet: <http://www.hotchips.org/wp-content/uploads/hc_archives/hc23/HC23.18.3-memory-FPGA/HC23.18.320-HybridCube-Paolowski-Micron.pdf>, (Aug. 4, 2011), 1-24.
Pugsley, S. H, et al., "NDC: Analyzing the Impact of 3D-Stacked Memory+Logic Devices on MapReduce Workloads", Performance Analysis of Systems and Software (ISPASS) IEEE International Symposium 2014, Retrieved from the Internet: <http://ieeexplore.ieee.org/stamptstamp.jsp?tp=&arnumber=6844483>, (Mar. 23, 2014), 190-192.
Thomas, Pawlowski J, "Hybrid memory cube (HMC)", 2011 IEEE Hot Chips 23 Symposium (HCS), 1-24.

* cited by examiner

| UNUSED [63:46] | DIRECTORY BITS [45:42] | CUB [41:34] | BASE PHYSICAL ADDRESS [33:0] |

Fig. 4

IN-MEMORY LIGHTWEIGHT MEMORY COHERENCE PROTOCOL

RELATED APPLICATIONS

This application is a continuation of U.S. application Ser. No. 14/706,490, filed May 7, 2015, which claims the priority benefit of U.S. Provisional Application Ser. No. 61/990,199, filed May 8, 2014, the contents of which are incorporated be reference in its entirety.

BACKGROUND

Multi-processor systems can include shared memory that allows more than one processor to perform operations on the same data. Access to shared memory can be slow and can lead to system latency. To improve memory access time, multi-processor shared memory systems can include a relatively smaller but faster access cache memory. Cache memory stores a copy of data that may be frequently accessed by the processors. To maintain correctness of cached data, a cache coherence protocol is followed. A cache coherence protocol imposes rules on access to cached data by processors to ensure that data is correct across all of the processors despite the existence of multiple copies of the data. However, cache coherence protocols can consume precious system bandwidth and produce uneven latency for data access. The present inventors have recognized a need for improved data management in multi-processor shared memory systems.

BRIEF DESCRIPTION OF THE FIGURES

FIG. 4 shows an example of a coherence directory memory format, as may be used to practice some embodiments of the invention.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the various embodiments of the invention, which is defined only by the appended claims.

In conventional computer systems, memory is organized two-dimensionally into rows and columns. Efforts to improve memory access latency have included development of double data rate type three (DDR3) or DDR4 with a high bandwidth interface. DDR3 and DDR4 use the traditional row/column approach.

Figure 1:
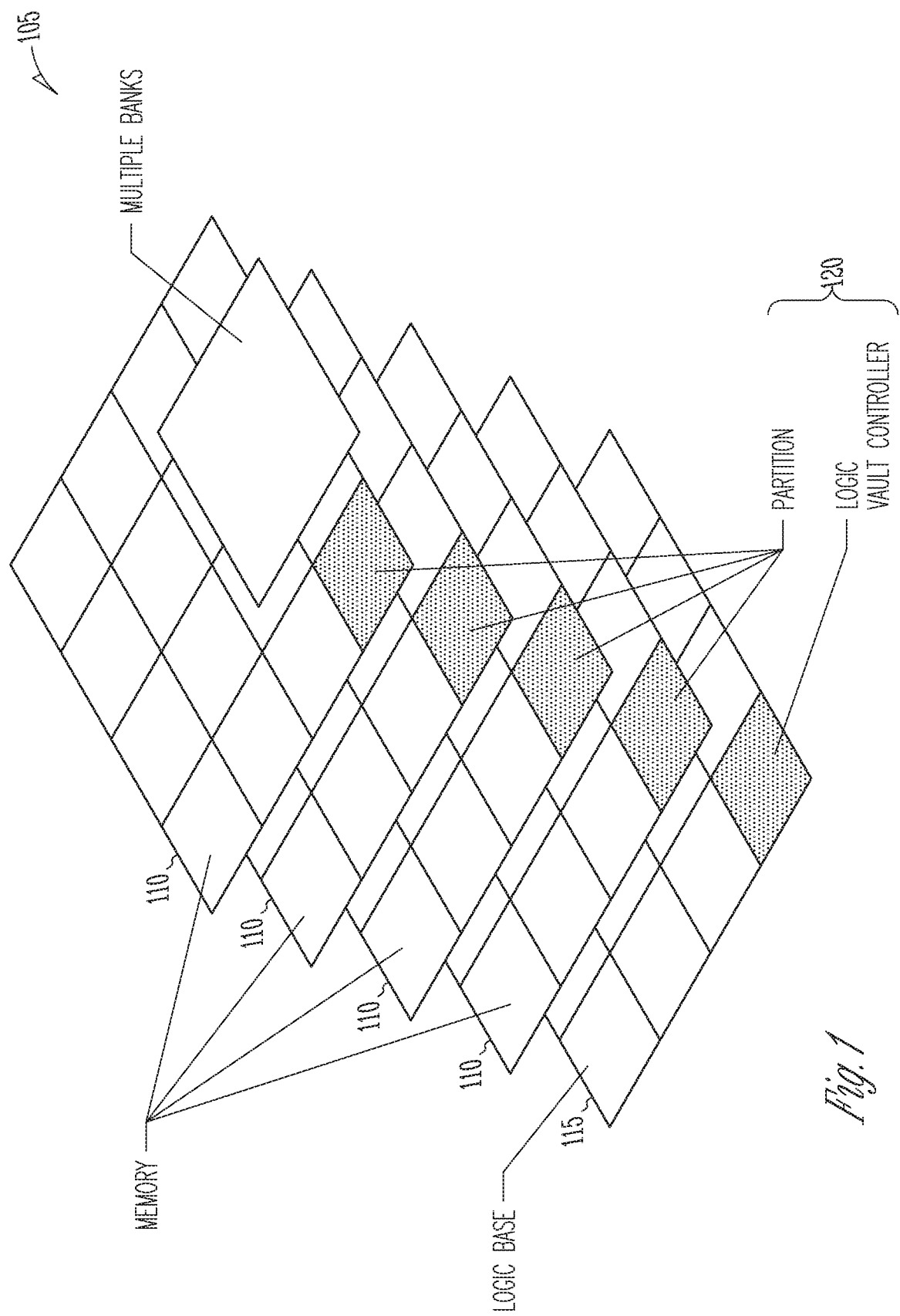
FIG. 1 illustrates a representation of a Hybrid Memory Cube, as may be used to practice some embodiments of the invention.

FIG. 1 illustrates a representation of a Hybrid Memory Cube 105 (HMC). An HMC includes a third dimension by stacking integrated circuit (IC) memory die 110 and interconnecting the die using through silicon via (TSV) structures (not shown) that enable access on both the top and bottom of IC die. TSV manufacturing techniques enable interconnection of multiple die layers in order to construct three-dimensional dies. This ability of interconnecting multiple die layers permits building a memory device with a combination of memory storage layers and one or more logic layers. In this manner, the device provides the physical memory storage and logical memory transaction processing in a single electronic device package. The arrangement shown in FIG. 1 is to illustrate a concept and does not necessarily represent an actual die layout.

An HMC (e.g., as specified in the Hybrid Memory Cube Specification version 1.0) can provide a very compact and power efficient package with available bandwidth capacity of up to 320 GB/s per device. The HMC device is capable of high bandwidth via a hierarchical and parallel approach to the design. The device hierarchy occurs vertically across the logic layers and the hardware parallelism occurs across a given die layer. Within an HMC, memory is organized into vaults. Each vault 120 vertically spans each of the memory layers within the die using the through-silicon vias. In the simplified example of FIG. 1, the HMC is organized into 16 vaults with each vault having a logic base die layer 115 or logic base.

Figure 2:
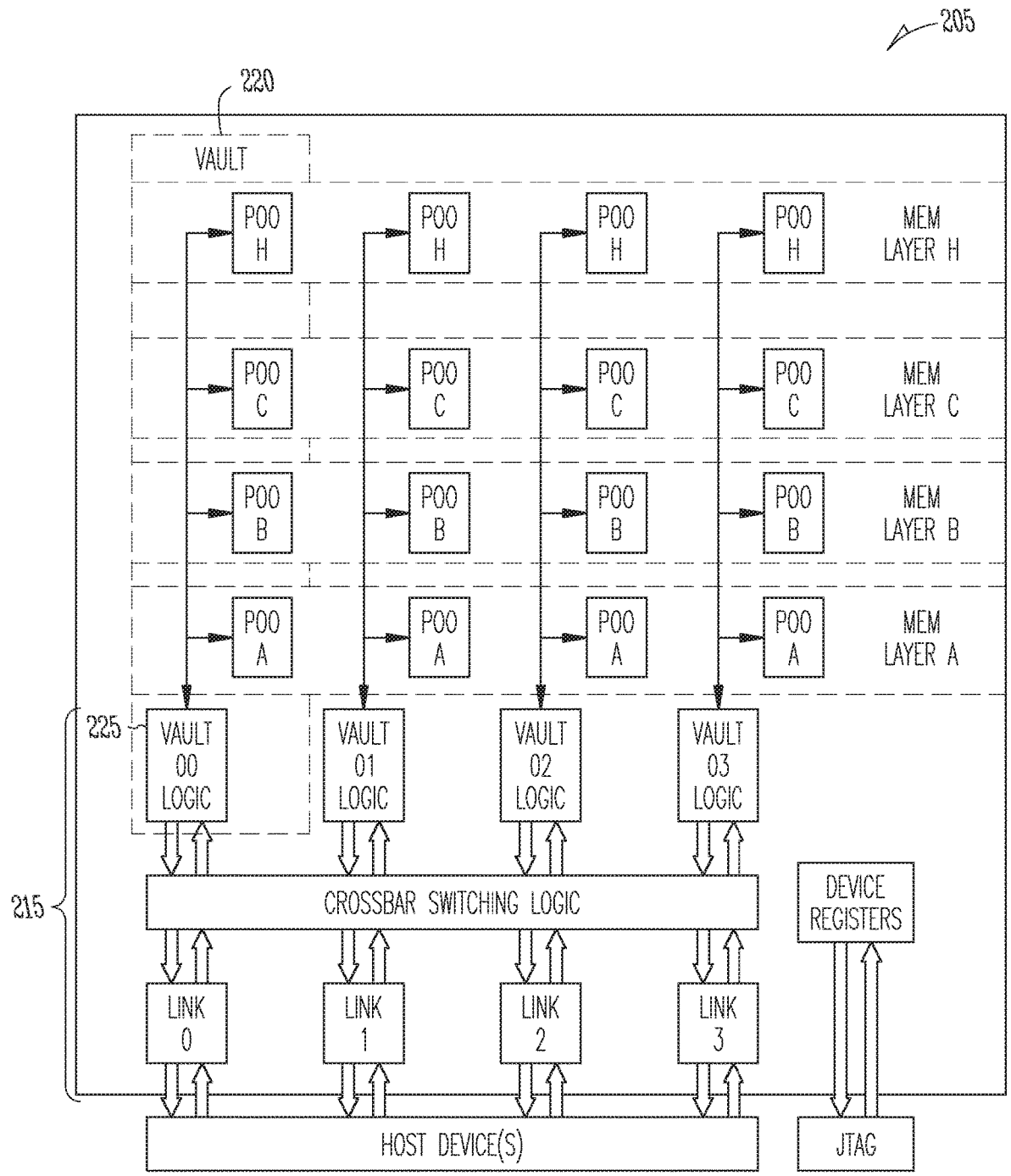
FIG. 2 is a block diagram illustrating a quadrant of a Hybrid Memory Cube, as may be used to practice some embodiments of the invention.

FIG. 2 is a block diagram illustrating a quadrant of an HMC 205. Four vaults of the HMC are shown with each vault 220 including multiple memory layers. The logic base layer 215 includes multiple components. For instance, each vault has a memory controller in the logic base that manages all memory reference operations for the vault. The memory controllers provide flexible access to the 3D storage layers. The 3D layered approach permits memory transactions to exist in parallel not only across banks within a target storage array, but also across parallel storage arrays. The logic base layer 215 may include one or more processors to implement the functions described, and an HMC can be a processor in memory (PIM) device.

The logic base layer 215 provides both external link access to the HMC device as well as internal routing and transaction logic. The external I/O links are provided by four or eight logical links. Each link can include a group of sixteen or eight serial I/O, or SERDES, bidirectional links. Four link devices have the ability to operate at 10, 12.5 and 15 Gbps. Eight link devices have the ability to operate at 10 Gbps. Internally, the links are attached to routing logic in order to direct transactions at logic devices that control each vertical memory storage unit. In the example of FIG. 2, the routing logic includes the cross bar switching logic.

The HMC link structure supports the ability to attach devices to both hosts (processors) or other HMC devices. This concept of chaining permits the construction of memory subsystems that require capacities larger than a single device while not perturbing the link structure and packetized transaction protocols. Links can be configured as host device links or pass-through links in a multitude of topologies.

Figure 3:
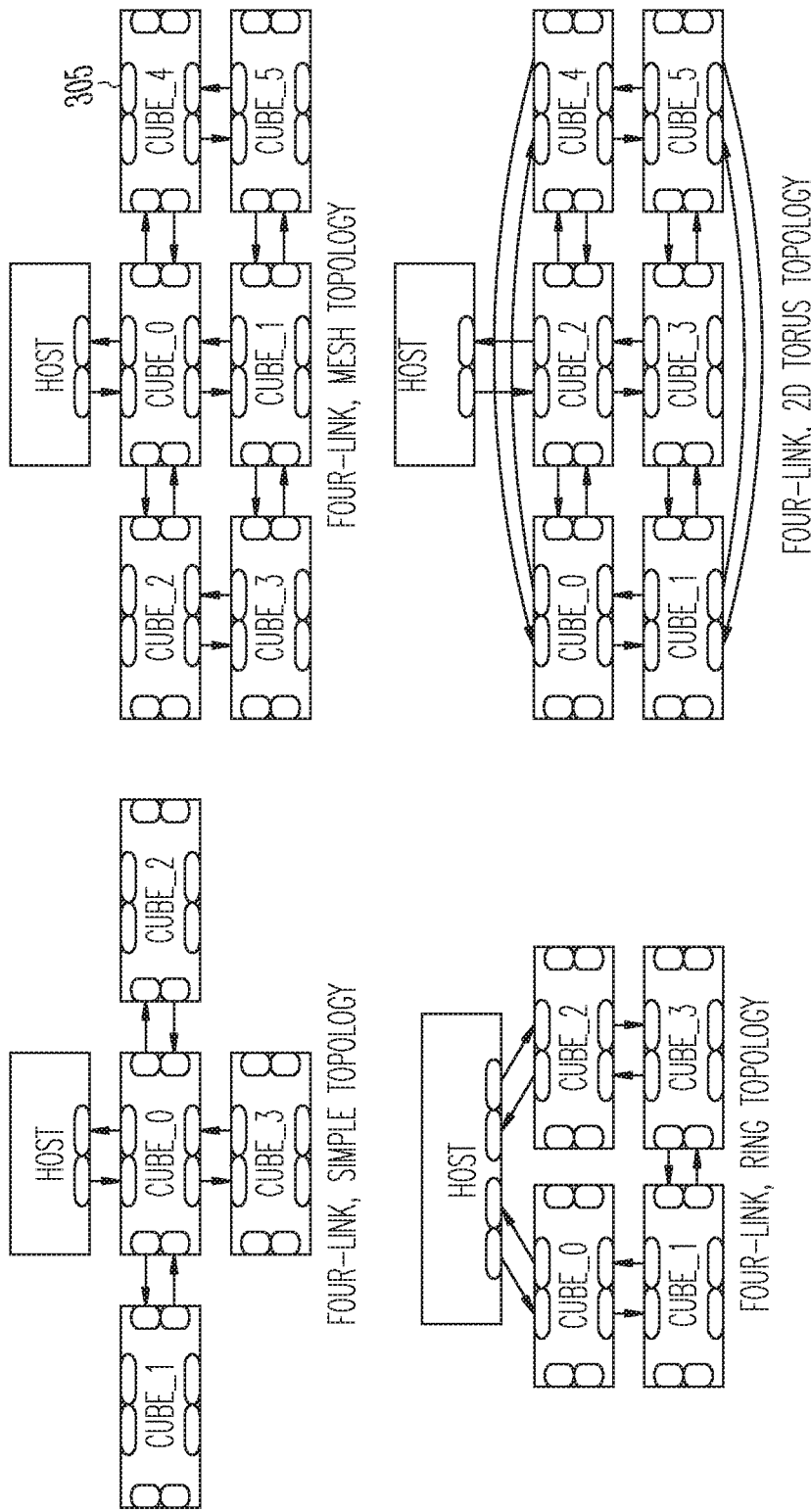
FIG. 3 shows block diagrams of four potential device topologies for Hybrid Memory Cubes, as may be used to practice some embodiments of the invention.

FIG. 3 shows block diagrams of four potential device topologies based upon the base four-link HMC configuration. The HMC memory devices 305 can be configured in a traditional network topology such as a mesh, torus or crossbar. Chaining the multiple HMC devices together increases the total memory capacity available to a host.

Returning to FIG. 2, the logic base layer for a vault is analogous to a DIMM controller unit for each independent vault. In the Example of FIG. 2, the vault logic blocks 225 and their respective vault storage units 220 can be organized into quad units. Each quad unit represents four vault units. Each quad unit is loosely associated with the closest physical link block. In this manner, host devices have the ability to minimize the latency through the logic base layer of an HMC device by logically sending request packets to links whose associated quad unit is physically closest to the required vault.

Once within a target memory vault, memory storage can be broken into the traditional concept of banks and dynamic random access memories (DRAMs). Vertical access through the stacked memory layers is analogous to choosing the appropriate memory bank. Lower banks can be configured in lower die layers while vertical ascension selects subsequent banks. Once within a bank layer, the DRAM can be organized traditionally using rows and columns. The vault controller breaks the DRAM into one megabit (1 Mb) blocks each addressing 16-bytes. Read or write requests to a target bank can be performed in 32-bytes for each column fetch.

For a multi-host multi-HMC system, in-band communication between host devices and HMC devices is performed using a packetized format. This packetized format can include three major packet classifications: request packets, response packets, and flow control packets. Packets can be configured as a multiple of a single 16-byte flow unit, or FLIT. The maximum packet size contains 9 FLITs, or 144 bytes. The minimum 16-byte (one FLIT) packet contains a packet header and packet tail. Memory read request packets for all memory payload sizes may only require the packet header, tail and the respective physical memory address. Therefore, read requests can be configured using a single FLIT. Write requests and atomic request packets, however, also contain the required input data for write and read-modify-write operations, respectively. Therefore, these request types have packet widths of 2-9 FLITs.

An HMC system implementation may have multiple packet reordering points. Arriving packets that are destined for ancillary devices may pass those waiting for local vault access. Local vaults may also reorder queued packets in order to make the most efficient use of bandwidth to and from the respective vault banks. However, reordering points present in a given HMC implementation maintain the order of a stream of packets from a specific link to a specific bank within a vault. This ensures that memory write requests followed by memory read requests deliver correct and deterministic memory behavior.

As explained previously, an HMC provides a high bandwidth device. However, present system interconnect specifications typically lack sufficient functionality, flexibility and performance necessary to maintain appropriate balance in systems whose main memory is based on high bandwidth devices such as an HMC. For instance, a system architecture may include one or more HMCs to maintain a hundreds of gigabyte per second bandwidth between a system on chip (SoC) and local memory, but the system architecture may provide system interconnect having only a fraction (e.g., one tenth) of this available bandwidth. The result can be a highly imbalanced system.

Further, if the processors attached to the system interconnect provide cache coherence mechanisms, separate logic blocks may have to be added to the system to provide sufficient bandwidth and functionality to maintain concurrency and correctness in both the shared memory and cache memory subsystems. This results in processor interconnect, memory interconnect, and system interconnect with a complex set of peripheral logic blocks and complex protocol specifications having different degrees of latency.

Inefficient cache coherency is especially a concern in applications with multiple threads (or tasks) of execution distributed among multiple SoC devices or sockets. If the core SoC or processor supports functional data caching, the cache coherency mechanism between the SoC sockets must support a local memory bandwidth that can be an order of magnitude higher than the bandwidth available on the system interconnect. Again, the result is a highly imbalanced system.

An approach to improve system level latency is to provide a memory coherence subsystem having a bandwidth of substantially the high bandwidth memory devices. One way to provide this is to implement system memory coherence using one or more HMC devices. Because the HMC has the ability to execute in-situ atomic memory operations, the HMC can be extended to provide a high bandwidth and low latency memory coherency mechanism.

In a conventional system, one approach for cache coherence is to use a directory-based cache coherence protocol. The coherence directory acts as a filter through which a processor seeks permission to load an entry from the primary memory to its cache. When an entry is changed the directory either updates or invalidates the other caches with that entry. Directory-based cache coherence includes maintenance of a "directory" that assigns state to cache lines. Every cache line can be assigned a "home node" as the ultimate arbiter of the state of the cache line. The home node owns the address space and gives permission to modify the cache line. The directory assigns status and the directory-based protocol then uses point-to-point communication among the hosts to process metadata.

Processors typically store a significant amount of cache line state information of the directory and rely on fast cache memory access to read cache metadata and determine the state of the cache line. A cache memory controller keeps track of which host checked out the cache line. In this configuration, the cache directories themselves must be cached (often fully-associatively) creating complex and power-hungry data structures that are maintained at last level caches or memory controllers. These data structures often do not fit on-chip and have to be backed by DRAM for large Symmetric Multiprocessor (SMP) configurations.

Because of the hierarchical nature of its physical memory storage, an HMC device has a different physical addressing and interleave model than do traditional banked DRAM devices (e.g., DDR3 or DDR4 devices). Physical addresses for HMC devices are encoded into a 34-bit field that contain the vault, bank, and address bits. An implementation with four link devices utilizes the lower 32-bits of the field and an implementation with eight link devices utilizes the lower 33-bits of the field.

In contrast to DDR3 or DDR4 devices, an HMC device can inexpensively implement an abstracted memory storage interface. For instance for a DDR type device, when a processor desires to access an address, the real or actual physical address is placed on a bus and accessed. In an HMC protocol, the physical address can be re-mapped when it arrives at the HMC to a different memory address. Thus, for an HMC there's no guarantee of the actual memory location written. Additionally, the HMC is not required to generate a response at a set time.

This address re-mapping capability of an HMC can be leveraged to implement directory-based memory coherence. To provide support for directory memory coherence, the base logic layer of the HMC can be configured to abstract the location of a given memory block into an associated memory word or "cache line." Thus, the memory coherence directory can be stored within the HMC storage vaults. This provides a methodology to manage both traditional memory traffic and cache coherency traffic using the same HMC protocol; thereby providing uniformity to local memory data access and system memory data access.

FIG. 4 shows an example of a coherence directory memory format. The direct memory space of an HMC can be described in terms of physical addresses that are included in the Base Physical Address field. In the example shown, up to 34 bits of physical address storage is available. The base physical address serves as the target for a memory operation and can include the vault, bank, and DRAM address bits. The address extension cube ID (CUB) field indicates the HMC device in which the memory backing the memory word resides. The Directory Bits field provides the memory coherency bits to maintain the state information of the memory word as if the memory word were a cache line. If the memory coherence directory uses the MESI coherence protocol, the Directory Bits include a modified bit, an exclusive bit, a shared bit, and an invalid bit. Accessing the data word as a cache line is performed by accessing the memory word associated with the base physical address plus the CUB offset. If a data entry includes eight bytes, a single 8 GB HMC device can support over one billion concurrent directory entries.

With memory coherency organized in this fashion, lookup and modification operations can be performed on the memory using the HMC atomic memory operations. Directory mutability is maintained while using transaction protocols native to HMC to interact with the directory. This makes the types of memory accesses more uniform.

Access to the directory entries can be performed using an atomic request. Atomic requests involve reading 16 bytes of data from DRAM (as accessed by the request address field), performing an operation on the data through the use of a 16-byte operand (also included in request packet), and then writing the results back to the same location in DRAM. The read-update-write sequence occurs atomically, meaning that no other request can access the same bank until the write of the atomic request is complete. Atomic requests are similar to a 16-byte write request in that they have a 16-byte data payload in the request packet, and a write response may or may not be returned (dependent on whether the requested is a posted or non-posted request). The data resulting from the atomic operation is not returned in a response command. Modifications to the directory entries can be performed using atomic memory operations, such as an ADD immediate request command of an HMC protocol for example.

Lookups to the directory entries can be performed using atomic memory operations as well, such as an ADD immediate request command where the target immediate value is zero for example.

Figure 5:
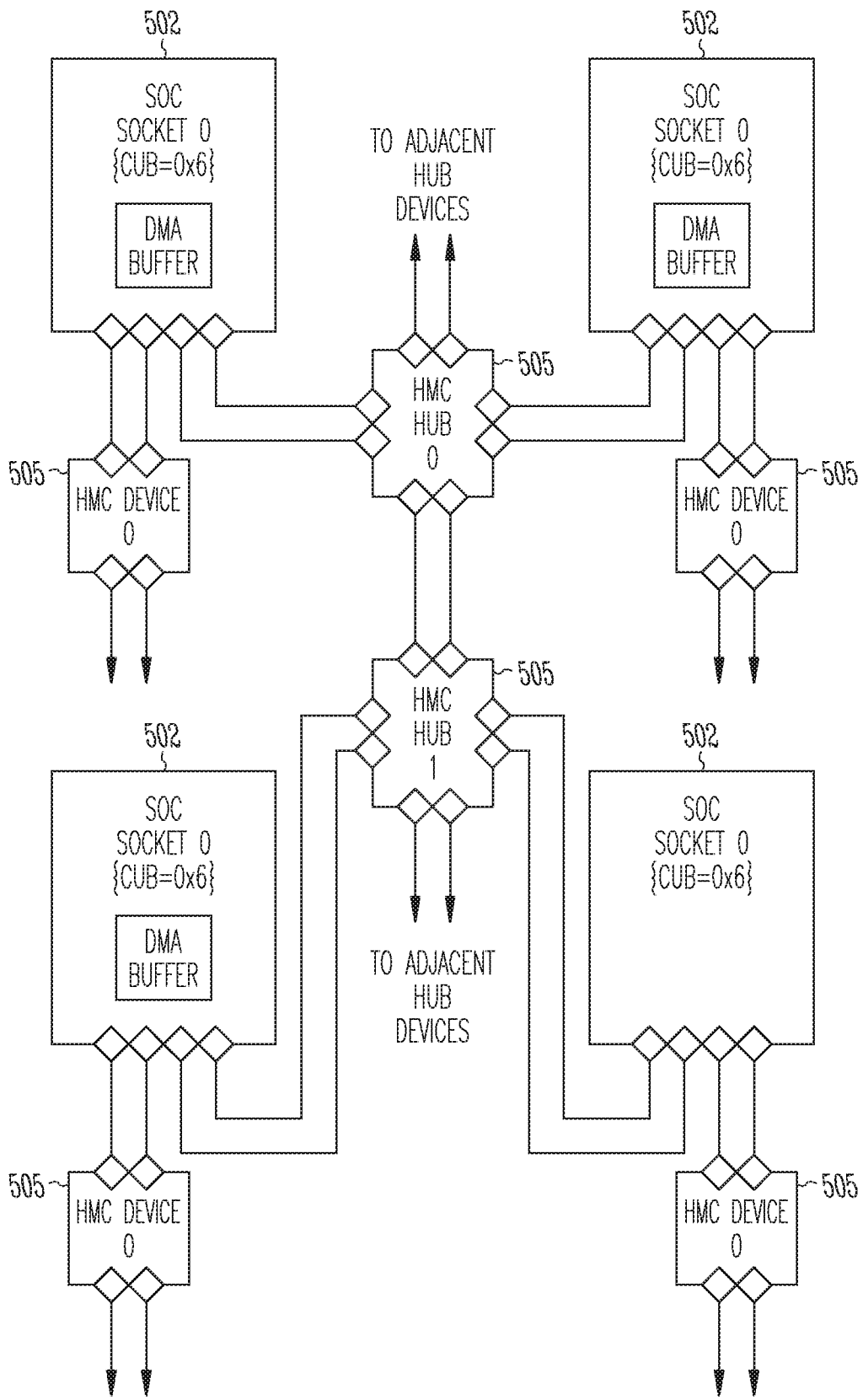
FIG. 5 shows a block diagram of an example of a computer system implemented with HMC devices, as may be used to practice some embodiments of the invention.

FIG. 5 shows a block diagram of an example of a computer system 500 implemented with HMC devices to include an HMC-based memory coherence directory. The system includes a plurality of host processors. The processors can be implemented as SoCs with each processor denoted by an SoC Socket 502. The example shows four processors but the system is flexible to include other numbers of processors.

The system also includes a plurality of HMC devices configured as a distributed shared memory for the host processors. Some of the HMC devices are used as endpoint devices and some HMC devices are used as hub devices. The hub devices may provide pass through communication capability to provide intra-system communication.

Given that the memory is implemented with HMC devices having memory die arranged three-dimensionally, the shared memory is configured for 3D memory access. At least a portion of the memory of the of the memory die of an HMC device 505 is mapped to include at least a portion of a memory coherence directory. This implies that conventional cache coherence data or metadata can be stored in memory where the memory word resides. A logic base die of an HMC device includes at least one memory controller that manages three-dimensional (3D) access to HMC device memory by at least one second device, such as a processor or another HMC device for example. The logic base die also includes logic circuitry that implements a memory coherence protocol for data stored in the memory of the plurality of memory die.

Because the coherence directory is stored in the HMC devices, an HMC device itself can serve as the home node for its own data. Memory coherence state information can be stored with the data. The logic base layer allows memory coherence state information to be communicated among the processors without storing the data in a separate cache. Data stored is the shared memory is essentially a cache line. Additionally, given that the memory coherence is implemented by the HMC devices, the processing overhead associated with maintaining memory coherence state information is removed from the processors.

As explained previously, for a multi-host multi-HMC system, I/O communication between host devices and HMC devices is performed using a packetized protocol. The memory coherence protocol can be included in this I/O protocol. The packetized information can include memory coherence state information. In some examples, the memory coherence state information can be included with address information as in the example of FIG. 4. Including the memory coherence protocol with the I/O protocol combines both functions into a unified efficient communication system. This minimizes latency in both local memory requests and system memory requests and eliminates protocol translations between local and system interfaces.

The state information determines whether a processor can safely write data to the memory word, whether the memory word currently holds valid data, and determines how the memory word can be transitioned into a state where reads or writes to the memory word are possible. In some examples, the logic circuitry of an HMC device implements an MSI cache coherence protocol and determines "modified" state information, "shared" state information, and "invalid" state information for a word of memory of the memory die and stores the state information in association with the word of memory of the memory die. In certain variations, the modified state information, shared state information, and invalid state information includes a modified bit, a shared bit, and an invalid bit, respectively. In certain examples, the logic circuitry of an HMC device implements an MESI cache that determines exclusivity state information. In certain examples, the logic circuitry of an HMC device implements an MOSI cache that determines ownership state information for a word of memory of the memory die. The logic circuitry stores one or both of exclusivity state information and ownership state in association with the word of shared memory data. In some examples, the hub HMC device adds routing information to a packetized message. The routing information can be used to (e.g., by a receiving HMC device) to determine memory coherence state information.

According to some examples, a "check-out/check-in" mechanism is used by processors wishing to update a particular memory word. In this case, the processor requests exclusive access to memory location X. Once that access is granted by the HMC device where the memory word resides, the memory word can be marked as "checked out" (either in a small associative table on the device or as an extra bit of state in memory). When data is checked back in by the processor, the HMC device presumes the data is updated. Thus the memory word itself will be written back by the processor (or "flushed") and the space in memory can be reused to store additional state information (e.g., state information indicating the device that checked out the memory word). Further requests for memory word X can receive a response from the HMC device combining both pieces of information (e.g., state information that the cache line is checked out by processor P). The directory-based coherence protocol then proceeds by using memory coherence state updates (e.g., processor P can be asked to flush the memory contents, etc.). When the processor P flushes the new data back to the home node (the HMC device of the memory word), the memory word can be checked in and the state information cleared.

In some examples, the HMC device responds to a specific state request for a target memory word. For instance, the target HMC device may receive a request from a processor for exclusive access to a memory word (e.g., a request for an exclusive state). The logic circuitry of the HMC device may initiate a read of the state information for the memory word. If the state information indicates that a second device already has exclusive access and ownership of the memory word, the logic circuitry may invalidate the memory word and wait for confirmation of the invalidation from the owning device. When confirmation is received, the HMC device may give exclusive access to the original requesting device.

Figure 6:
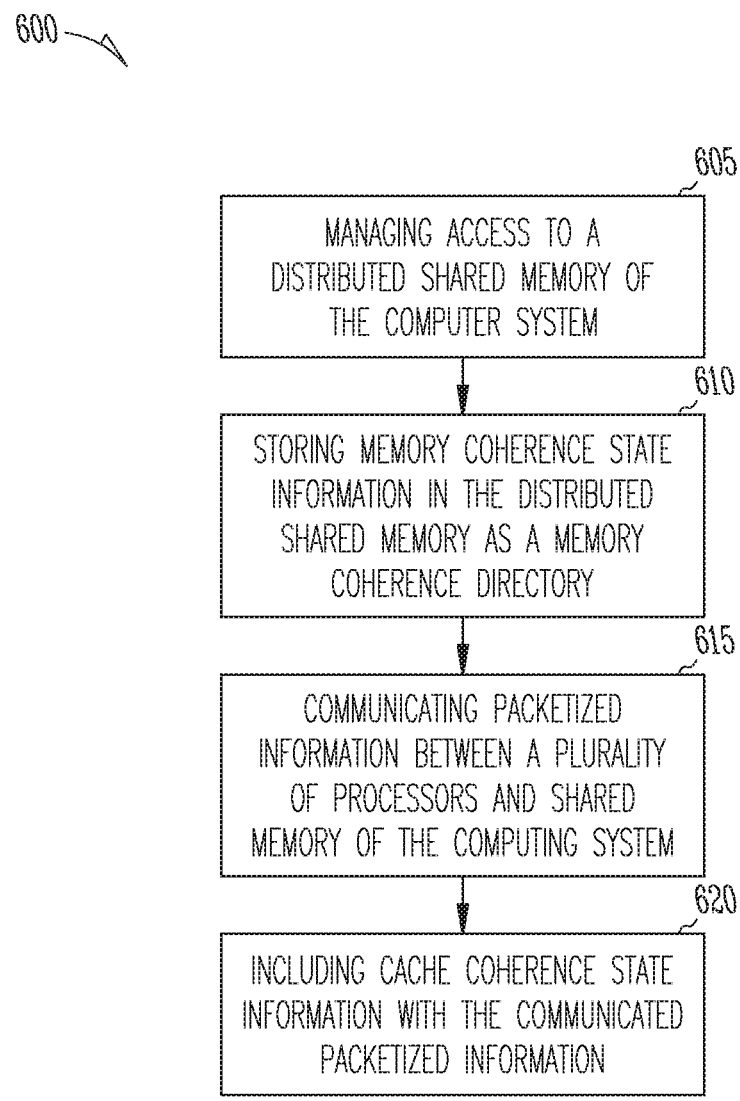
FIG. 6 shows a flow diagram of an example of a method of operating a computer system.

FIG. 6 shows a flow diagram of an example of a method 600 of operating a computer system, such as the example system shown in FIG. 5. At 605, access to a distributed shared memory of the computer system is managed such as by an HMC protocol. The shared memory is configured for three-dimensional access, and includes one or more HMC devices.

At 610, memory coherence state information is stored in the distributed shared memory as a memory coherence directory. In some examples, the memory coherence directory is distributed over multiple HMC devices of the computer system.

At 615, communicating packetized information is communicated between a plurality of processors and the shared memory of the computing system, and at 620 cache coherence state information is included with communicated the packetized information. In some examples, the 620 cache coherence state information is communicated point to point between processors of the computer system.

The example systems and methods described herein provide several advantages over a conventional multi-processor distributed shared memory system. The high bandwidth provided by the HMC devices results in a high bandwidth memory and high bandwidth system interconnect. The distribution of the HMC devices in the system architecture balances the bandwidth and the system latency characteristics between local memories and between other system level memories interconnected with HMC devices. Incorporating the memory coherence protocol into the system I/O protocol provides one uniform protocol that maintains atomicity of memory requests between local memories and system level memories. The uniform protocol minimizes latency by reducing or eliminating protocol translations between local memory access and system-level memory access, and by using an efficient HMC packet specification for both local memory access and system-level memory access. SoC design is simplified by offloading maintenance of the memory coherence directory and by simplifying coherence directory lookups by the SoC.

Another approach for cache coherence is to use a snooping protocol. In a snooping protocol, processors of a computer system monitor memory traffic being transmitted using a memory coherency interface that may provide point-to-point communication among the processors. In contrast to a directory-based approach, the processors track state information from the communications over the coherency interface rather than by accessing a directory to determine state information. For an MSI snooping protocol, the memory coherence interface broadcasts whether or not a particular cache line is in the modified, shared, or invalid state, allowing cache memories and processors to update the state of shared copies accordingly. For instance, when modifying a cache line, other copies of the cache line in the system must be invalidated so that coherent data can be maintained.

HMC devices of a computer system can be configured to offload the snooping functions from the processors, such as by incorporating the memory coherence broadcast protocol into the I/O protocol of the system. An HMC device keeping track of the state of memory words (or snooping) could respond to requests for shared memory words just as any conventional cache memory responds to requests for shared cache lines.

For instance, a logic base layer for a vault of an HMC device may include logic circuitry that determines state information for a memory word that resides in its device. When read access is given to the memory word, the logic circuitry of a logic base layer may set the state information for that memory word to "exclusive" to give exclusive access to the requester. The state information may be returned with the packetized response to the read access. Other HMC devices can track state information included in the packetized communications (e.g., by using an extended HMC protocol). Some HMC devices in the computer system (e.g., Hub HMC devices) include pass-through links to facilitate packet routing. The pass-through links can be used to track state information communicated in the response packets. An endpoint such as an HMC host link or processor can inquire about state information from the owner of a memory word by transmitting a non-modifying request to the memory word. State information can be returned in a packetized response communication to the non-modifying request and other HMC devices can detect state information from the response packet.

Figure 7:
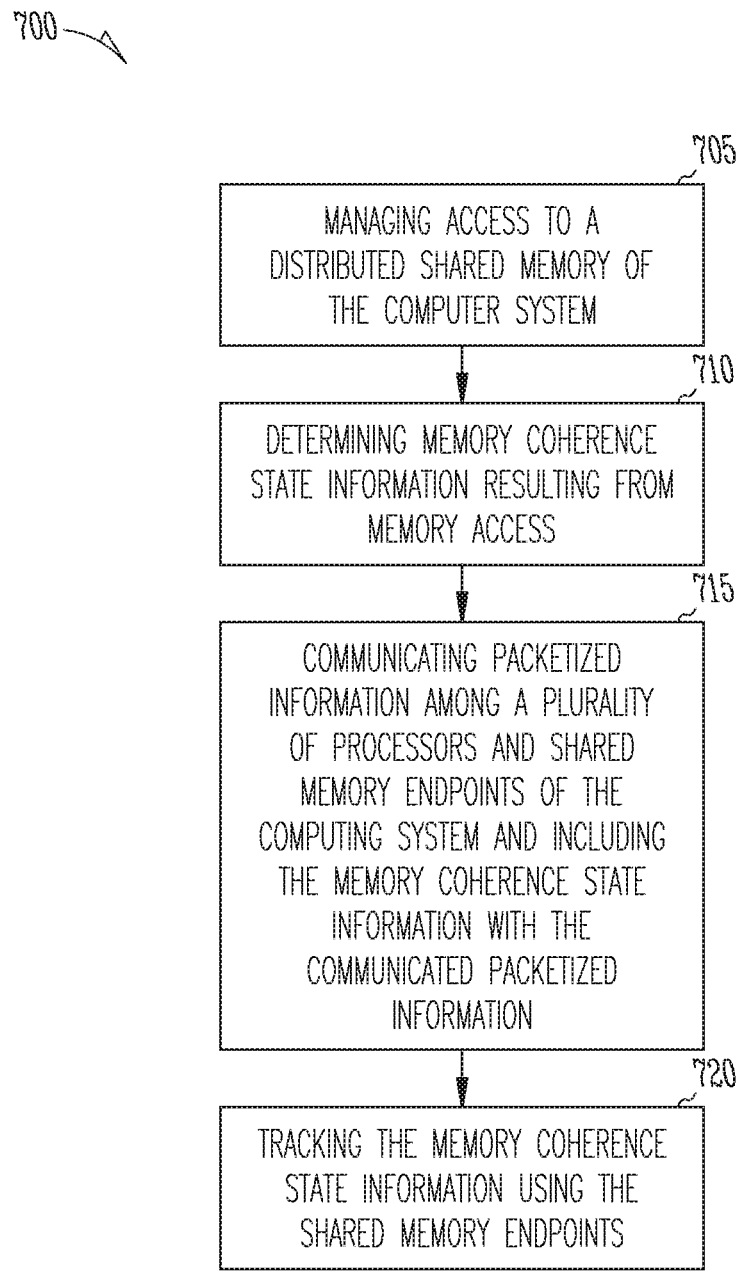
FIG. 7 shows a flow diagram of another example of a method of operating a computer system.

FIG. 7 shows a flow diagram of another example of a method 700 of operating a computer system. The computer system includes a plurality of HMC devices configured as a shared memory. At 705, access to a distributed shared memory of the computer system is managed (e.g., using an extended HMC protocol). At 710, the distributed shared memory determines memory coherence state information resulting from memory access. In some examples, the shared memory is distributed over multiple HMC devices and the memory coherence state information is determined using the HMC devices.

At 715, packetized information is communicated among a plurality of processors and the shared memory endpoints of the computing system. The memory coherence state information is included with the communicated packetized information. In some examples, the packetized information is communicated using an extended HMC protocol. At 720, the broadcast memory coherence state information is tracked or snooped using the shared memory endpoints.

Snooped invalidation and writeback would enable coherent copies of the data to be maintained in memory and may result in overall simplification of the system protocol. Incorporation of the protocol into the packetized communication of the memory interface may increase the number of responding agents (or responding endpoints), but the high bandwidth of the HMC devices can also potentially enable faster and more scalable responses.

Although specific embodiments have been illustrated and described herein, it will be appreciated by those of ordinary skill in the art that any arrangement that achieve the same purpose, structure, or function may be substituted for the specific embodiments shown.

For example, the above description refers to HMC devices in particular. However, HMC devices are just one illustrative example of implementing a computer system to take advantage of the embodiments described. One of ordinary skill in the art would understand, upon reading the specification, that the embodiments could be applied to computer systems implemented with other devices. For instance, the embodiments may be implemented with one or both of processor-in-memory (PIM) devices and DRAMs. A PIM device refers to one or more processors being tightly coupled to memory. Sometimes the one or more processors of a PIM device are included in the same IC with the memory devices. The PIM device may also include logic circuitry to implement a memory coherence protocol for data stored in the memory of the PIM device or devices.

In this document, the terms "a" or "an" are used, as is common in patent documents, to include one or more than one, independent of any other instances or usages of "at least one" or "one or more," In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

This application is intended to cover any adaptations or variations of the example embodiments of the invention described herein. It is intended that this invention be limited only by the claims, and the full scope of equivalents thereof.

The invention claimed is:

1. A computing system comprising:
   multiple memory devices configured as a system distributed shared memory for at least one host processing device of the computing system, wherein input/output (I/O) information is communicated among the multiple memory devices and the at least one host processing device using a packetized I/O protocol, and wherein each memory device includes:
   multiple memory dies, wherein at least a portion of the memory of the memory dies is mapped to include at least a portion of a memory coherence directory; and
   a logic base die excluding the at least one host processing device and including at least one memory controller configured to manage access to memory of the memory dies by the at least one host processing device, and logic circuitry configured to:
   determine memory coherence state information for data stored in the memory of one or more of the memory dies;
   store the memory coherence state information with the data in the memory dies;
   grant access to the stored memory coherence state information in response to an atomic memory request, wherein the stored memory coherence information for a memory word is accessed by the logic circuitry remapping an address of the memory word received in the atomic memory request; and
   include the memory coherence state information in a packetized message of the packetized I/O protocol sent in response to the atomic memory request.

2. The computing system of claim 1, including at least one memory device configured as a hub memory device that includes:
   at least one pass-through link configured to route packetized messages; and
   logic circuitry configured to snoop memory coherence state information in the routed packetized messages.

3. The computing system of claim 1, wherein the logic circuitry of each memory device is configured to:
   broadcast a packetized message that includes the memory coherence state information using the packetized I/O protocol; and
   snoop the memory coherence state information included in packetized messages broadcast by other memory devices.

4. The computing system of claim 1, wherein the logic circuitry of each memory device is configured to:
   route packetized information as part of the packetized I/O protocol; and
   detect memory coherence state information included in the routed packetized information.

5. The computing system of claim 1, wherein the logic circuitry of each memory device is configured to:
   determine modified state information, shared state information, and invalid state information for a word of memory of the memory dies; and
   store the state information in association with the word of memory of the memory dies.

6. The computing system of claim 1, wherein the logic circuitry of each memory device is configured to:
   determine at least one of exclusivity state information and ownership state information for a word of memory of the memory die; and store the state information in association with the word of shared memory data.

7. The computing system of claim 1, including:
at least one memory device configured as a hub memory device; and
wherein logic circuitry of the hub memory device adds routing information to a packetized message and monitors memory coherence state information in other packetized messages.

8. The computing system of claim 1, wherein the memory controller of the logic base die of each memory is configured to manage access to memory of the memory dies by the at least one host processing device and by another memory device.

9. A method of operating a computer system that includes system processing devices and a distributed shared memory that excludes the system processing devices, the method comprising:
determining, by the distributed shared memory, memory coherence state information resulting from memory access by the system processing devices and storing the memory coherence state information with the data in the distributed shared memory;
communicating packetized information among the system processing devices and multiple shared memory endpoints of the computing system using a packetized input/output (I/O) protocol;
initiating, by the distributed shared memory according to the packetized I/O protocol, sending of a packetized message including the stored memory coherence state information in response to an atomic request to access the memory coherence state information stored in the distributed shared memory, wherein the stored memory coherence state information for a memory word is accessed by the distributed shared memory remapping an address of the memory word received in the atomic memory request; and
tracking the memory coherence state information using the shared memory endpoints.

10. The method of claim 9, wherein tracking the memory coherence state information using the shared memory endpoints includes snooping the memory coherence state information in the packetized message using memory devices that include the shared memory.

11. The method of claim 9, including storing the memory coherence state information with a shared memory data word.

12. The method of claim 9, including modifying the memory coherence state information using a logic base layer that includes at least one memory controller for the shared memory.

13. The method of claim 9, wherein determining memory coherence state information by the shared memory includes storing a modified bit, a shared bit, and an invalid bit with the shared memory data word.

14. The method of claim 9, including:
receiving, from a separate device by a shared memory endpoint, a non-modifying request to a memory word; and
sending, by the shared memory endpoint, a packetized response communication to the non-modifying request, wherein the packetized response includes memory state information of the memory word.

15. The method of claim 9, including:
receiving, from a separate device by a shared memory endpoint, a request for memory access to a memory word;
setting, by the shared memory endpoint, memory state information of the memory word according to the request;
sending, by the shared memory endpoint, a packetized response communication to the request, wherein the packetized response includes the memory state information of the memory word.

16. An electronic device of a single electronic device package, the electronic device including:
multiple integrated circuit memory dies configured as a system shared memory, and at least a portion of the system shared memory of the memory dies mapped to include at least a portion of a memory coherence directory; and
wherein the system shared memory includes a logic base die included in the single electronic device package and separate from the logic base die excluding a system processor, the logic base die including at least one memory controller configured to manage access to the system shared memory by at least one separate device, and logic circuitry configured to determine memory coherence state information for data stored in the system shared memory, grant access to stored memory coherence state information stored in the system shared memory in response to an atomic memory request, wherein the stored memory coherence state information for a memory word is accessed by the logic circuitry remapping an address of the memory word included in the atomic memory request, and include the stored memory coherence state information in a packetized message of a packetized input/output (I/O) protocol that is sent in response to the atomic memory request.

17. The electronic device of claim 16, wherein the logic circuitry of the logic base die is configured to broadcast the memory coherence state information using the packetized I/O protocol.

18. The electronic device of claim 17, wherein the logic circuitry of the logic base die is configured to:
route packetized information as part of the I/O protocol;
snoop memory coherence state information included with the routed packetized information; and
update memory coherence state information stored by the electronic device according to the monitored state information.

19. The electronic device of claim 16, wherein the logic circuitry of the logic base die is configured to determine modified state information, shared state information, and invalid state information for a word of memory of the memory die and store the state information in association with the word of memory of the memory die.

20. The electronic device of claim 16, wherein the logic circuitry of the logic base die is configured to determine at least one of exclusivity state information and ownership state information for a word of memory of the memory die and store the state information in association with the word of shared memory data.

* * * * *